United States Patent [19]

Struger et al.

[11] 4,151,580
[45] Apr. 24, 1979

[54] CIRCUIT BOARD ASSEMBLY WITH DISCONNECT ARM

[75] Inventors: Odo J. Struger, Chagrin Falls; Edwin L. Bremenour, Euclid; James F. Burns, Chagrin Falls; Ronald E. Jerva, Mentor-on-the-Lake, all of Ohio

[73] Assignee: Allen-Bradley Company, Milwaukee, Wis.

[21] Appl. No.: 853,227

[22] Filed: Nov. 21, 1977

[51] Int. Cl.² .............................................. H02B 1/02
[52] U.S. Cl. ................................................... 361/415
[58] Field of Search ................ 361/415, 413; 211/41; 339/176 MP, 17 M, 17 LM, 4, 34; 179/98

[56] References Cited

U.S. PATENT DOCUMENTS

| | | | |
|---|---|---|---|
| 3,691,430 | 9/1972 | Freitag | 361/415 |
| 3,992,654 | 11/1976 | Springer et al. | 361/415 |

FOREIGN PATENT DOCUMENTS

| | | | |
|---|---|---|---|
| 1126450 | 10/1968 | Fed. Rep. of Germany | 361/415 |
| 809840 | 3/1959 | United Kingdom | 361/413 |

*Primary Examiner*—David Smith, Jr.
*Attorney, Agent, or Firm*—Quarles & Brady

[57] ABSTRACT

A set of circuit boards are mounted side by side and electrical connection is made to terminal pads disposed along one edge of each circuit board by connectors which are carried by swing arms. The swing arms are rotatably mounted on a support rod which also mounts a set of lower guide rails supporting the set of circuit boards. A set of status indicator lights are disposed along the same edge of each circuit board above each swing arm. A swing arm latching mechanism holds the swing arm in a vertical operating position. A circuit board latching mechanism holds the circuit board in place when the swing arm is pivoted to a maintenance position.

12 Claims, 6 Drawing Figures

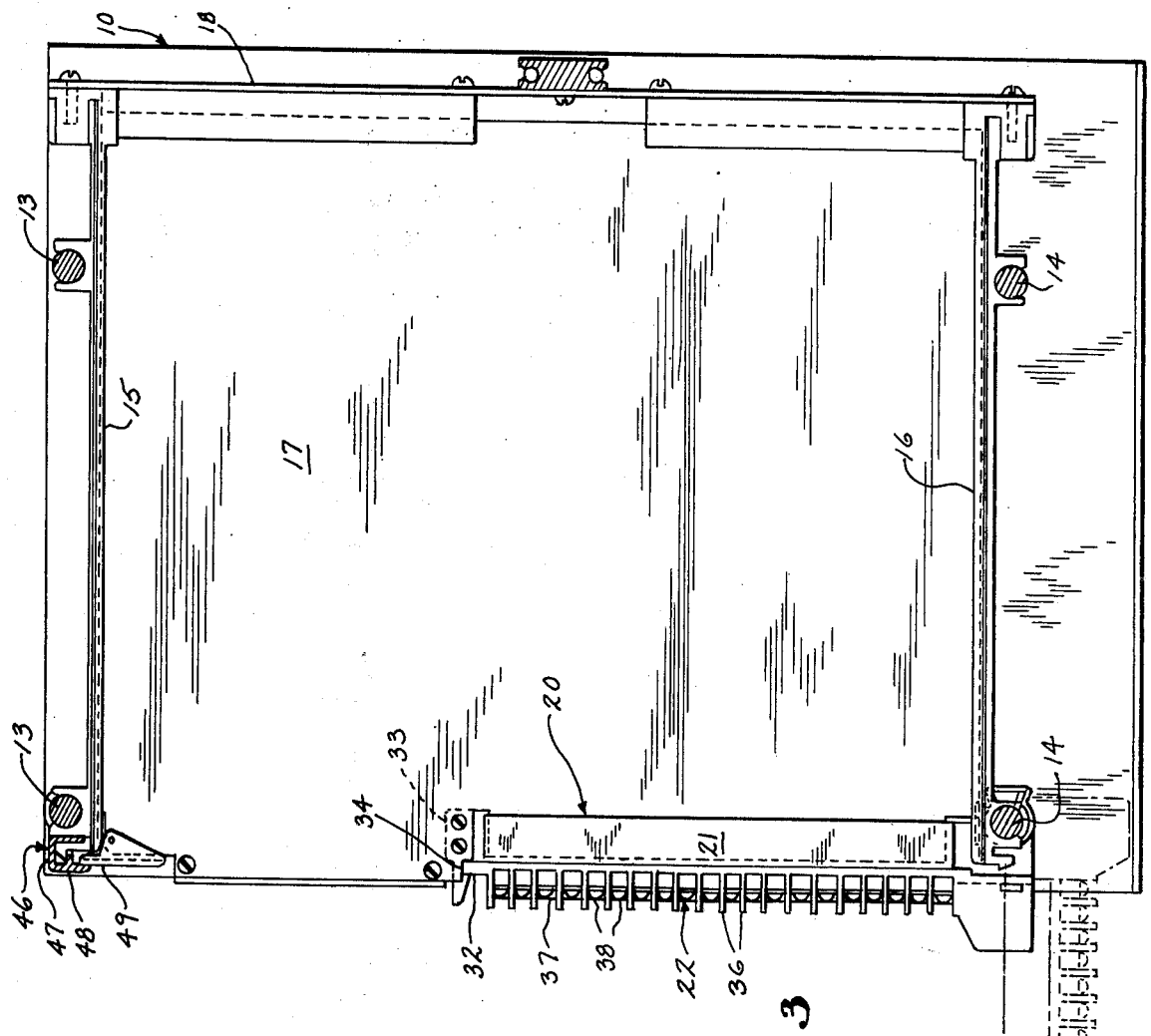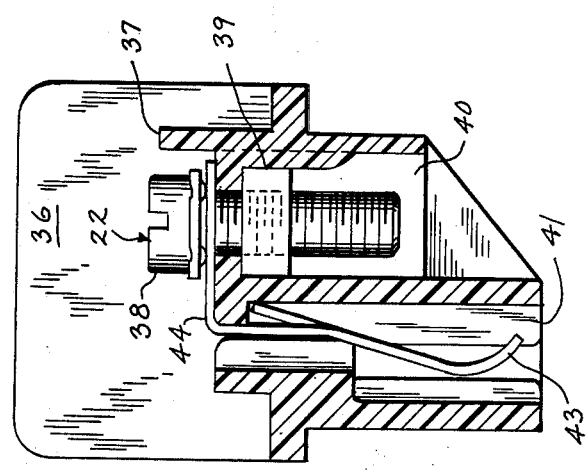

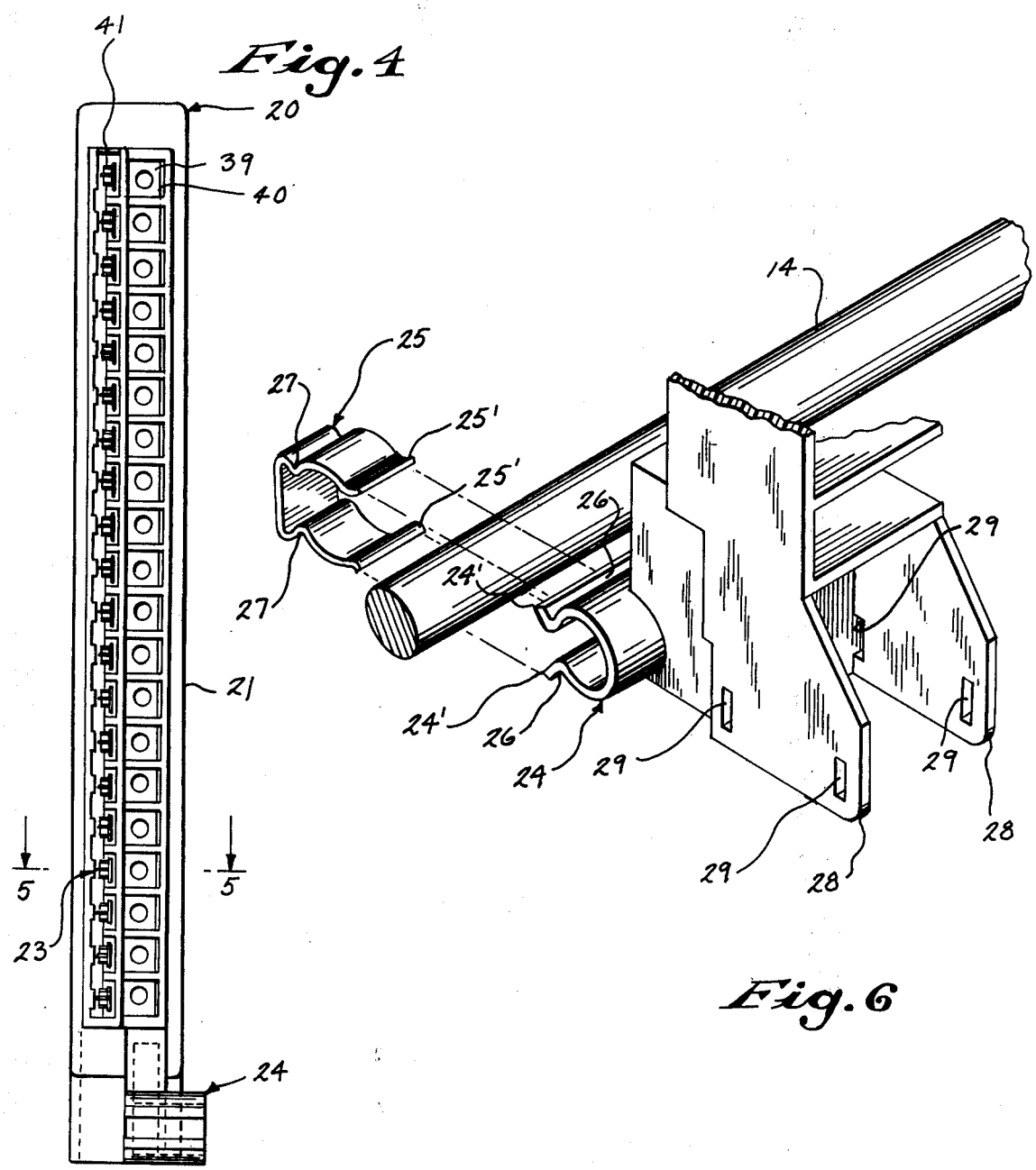

CIRCUIT BOARD ASSEMBLY WITH DISCONNECT ARM

BACKGROUND OF THE INVENTION

The invention relates to circuit board assemblies which include an electrical disconnect arm for removably connecting a set of wires to a set of terminals which are disposed along one edge of an electrical circuit board.

In electrical apparatus such as solid state controllers, numerical control systems, programmable controllers, digital computers and communications equipment, the circuit components are mounted on one or more circuit boards which are closely spaced to one another within a rack or frame and are interconnected by a wire harness or "mother board". In numerical control systems and programmable controllers some of the circuit boards are also connected to input and output (I/O) devices. These I/O hardware interface circuit boards have often been mounted in an I/O rack apart from other circuit boards in the system, such as memory circuit boards and processor circuit boards, which have been mounted in a processor rack. While this is advantageous in some applications, such as one requiring location of several I/O racks in areas remote from the processor rack, in other applications it is advantageous to have a system combining the circuit boards in a single rack thereby reducing the size and amount of hardware in the system.

The connection between I/O circuit boards and external devices may involve hundreds or even thousands of wires. To disconnect these wires and to expose each I/O circuit board for inspection, repair and replacement, swinging arm connectors have been devised. These connectors are pivotably mounted for swinging motion between an operating position in which the connectors are plugged into an associated circuit board and a maintenance position in which the connectors are unplugged and swung to a position that permits removal of the circuit boards. One such connector is disclosed by William B. Springer et al in U.S. Pat. No. 3,992,654 entitled "Disconnect Arm for Electrical Equipment".

SUMMARY OF THE INVENTION

The invention is a circuit board assembly which includes a frame, upper and lower support rods disposed in the frame substantially parallel to each other, a plurality of lower guide rails mounted at regular intervals along the lower support rod, a plurality of upper guide rails mounted at regular intervals along the upper support rod, each of the upper guide rails being disposed above one of the lower guide rails to receive a circuit board therebetween, and an electrical connector associated with a circuit board and rotatably mounted at one end to one of the support rods in an interval between the lower guide rail which mounts the circuit board and an adjacent guide rail, the electrical connector being rotatable between an operating position in which it engages the circuit board and a maintenance position in which the circuit board can be removed from between the upper and lower guide rails which mount it.

A general object of the invention is to insure that the electrical connector is aligned to swing in the plane defined by its associated circuit board, while also providing the proper spacing between the guide rail supporting the circuit board and an adjacent guid rail and eliminating the necessity of a separate supporting structure for the electrical connector. This object is achieved by mounting the electrical connector on the same support rod as the lower guide rails.

A further general object of the invention is to reduce the size and amount of hardward necessary to make hundreds or even thousands of I/O interface connections in electrical equipment by alternately mounting a plurality of electrical connectors with a set of lower guide rails on a single support rod.

A more specific object of the invention is to facilitate the installation and removal of the electrical connector by including a swing arm having an integrally molded clamping member which is formed at one end of the swing arm and which rotatably mounts the electrical connector on the lower support rod. The clamping member includes a pair of yieldable opposing figures that can be forced apart and easily snapped over and substantially around the support rod.

A further specific object of the invention is to securely fasten the electrical connector to the support rod by providing a clip having yieldable opposing fingers that can be forced apart and snapped over and substantially around the fingers of the clamping member.

A further specific object of the invention is to provide a swing arm latching mechanism which reliably holds each electrical connector in an operating position in which it engages its associated circuit board and which simply operates to release the electrical connector for rotation to its maintenance position.

A further specific object of the invention is to provide space for a set of circuit elements such as light emitting diodes (LEDs) or trimmer potentiometers along a segment of the connecting edge of each I/O circuit board. To achieve this object the electrical connector engages only part of the circuit board connecting edge.

Still another specific object of the invention is to provide a circuit board latching mechanism which holds the circuit board in place as its associated electrical connector is moved from the operating position to the maintenance position.

The foregoing and other objects and advantages of the invention will appear from the following description.

BRIEF DESCRIPTION OF THE DRAWINGS

FIG. 3 is a sectional view of the assembly of FIG. 2 taken along the lines indicated;

FIG. 4 is an elevation view of the back side of an electrical connector which forms a part of the invention of FIG. 1;

FIG. 5 is a sectional view of the electrical connector of FIG. 4 taken along the lines indicated; and FIG. 6 is a partial perspective view with parts exploded of the electrical connector and the support rod which form a part of the assembly of FIG. 1.

DESCRIPTION OF THE PREFERRED EMBODIMENT

Figure 1:
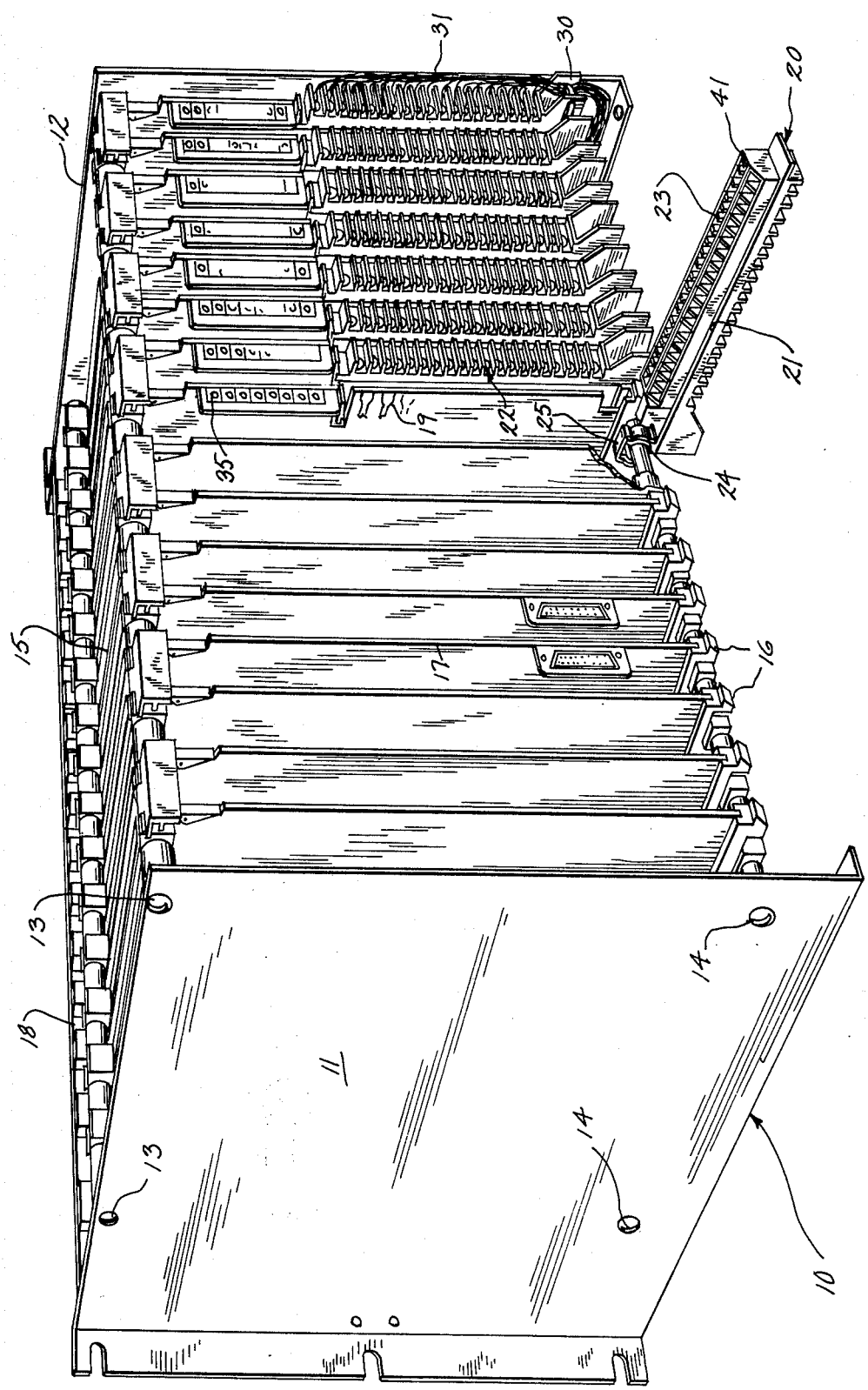
FIG. 1 is a perspective view with parts cut away of a circuit board assembly which incorporates the present invention.

Referring to FIG. 1, the invention is shown embodied in a numerical control system having eight positions in its rack for I/O circuit boards and eight positions available for other types of circuit boards. It can be appreciated by one skilled in the art that the invention can also be practiced with a different mix of I/O and non-I/O circuit boards and the invention can be employed in programmable controllers and other types of electrical equipment.

Figure 2:
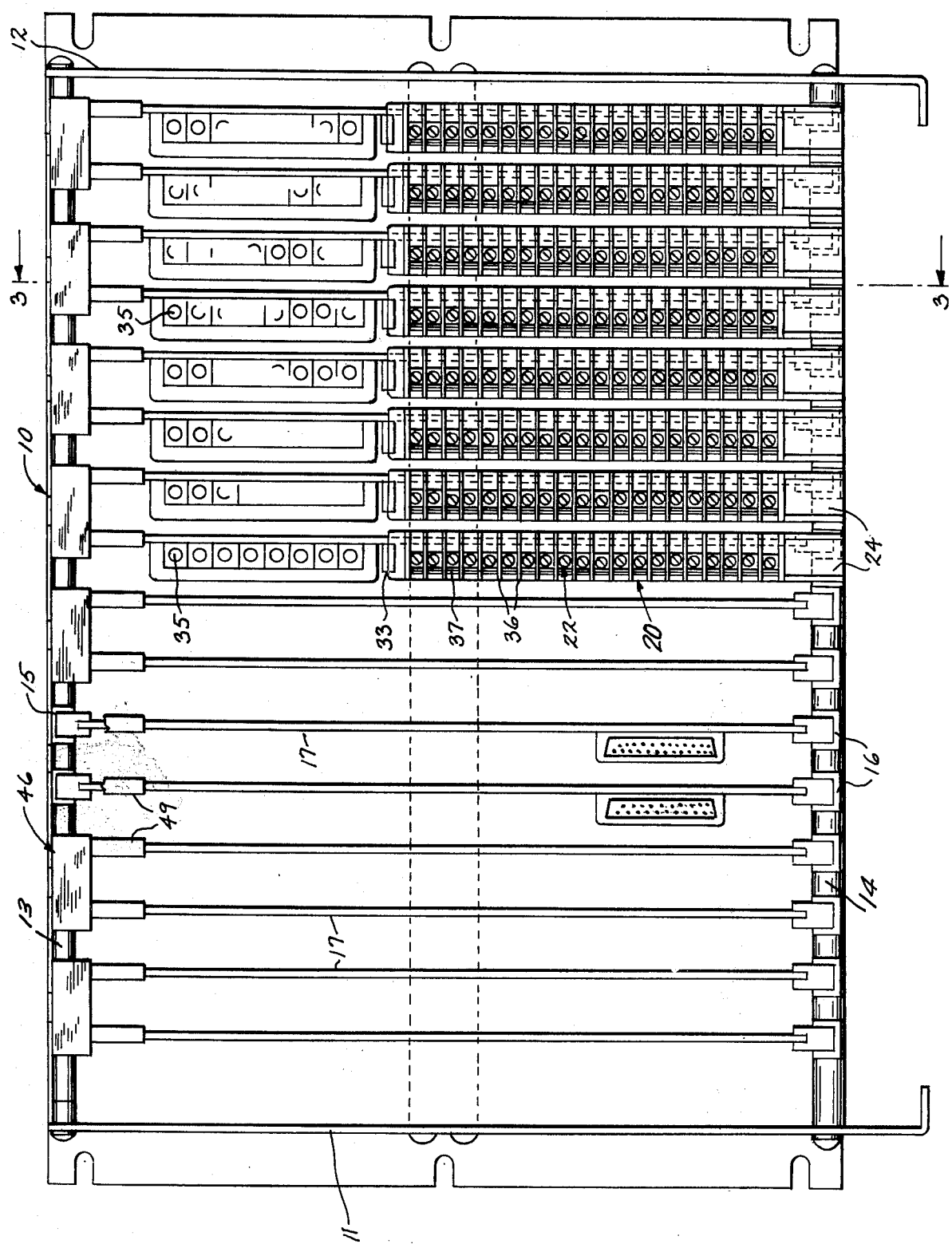
FIG. 2 is a front elevation view of the assembly of FIG. 1.

The rack includes a frame 10 having a pair of upright side walls 11 and 12 which are fastened to one another by a pair of upper support rods 13 and a pair of lower support rods 14. The support rods 13 and 14 are parallel to one another and a set of upper guide rails 15 and a set of lower guide rails 16 connect between the upper support rods 13 and the lower support rods 14, respectively. As shown in FIG. 2 each of the upper guide rails 15 includes a slot which receives the top edge of a circuit board 17. Similarly, each of the lower guide rails 16 includes a slot which receives a bottom edge of a circuit board 17. The guide rails 15 and 16 are spaced at regular intervals along their respective support rods 13 and 14 such that the circuit boards 17 are retained between the side walls 11 and 12 in closely spaced, substantially parallel planes. The guide rails 15 and 16 are disposed in the planes of their respective circuit boards 17, while the support rods 13 and 14 extend substantially perpendicular to the circuit board planes.

Referring again to FIG. 1, the circuit boards 17 are each rectangular and have upper and lower edges which are received in the slotted guide rails 15 and 16. The back edge of each circuit board 17 is connected to a mother board 18 located on the back side of the frame 10. A set of terminal pads 19 are formed along the front edge of each circuit board 17 for connection to a plurality of I/O devices, the front edges aligning to form an I/O connection plane.

Referring to FIGS. 2 and 3, the lower support rod 14 closer to the I/O connection plane, hereafter called the front lower support rod, pivotally mounts a set of eight electrical connectors 20 which are disposed side by side across the I/O connection plane. Each electrical connector 20 includes a swing arm 21, a set of wire terminals 22 disposed on a front side of the swing arm 21, and a set of edge connectors 23, not shown in FIGS. 2 and 3, disposed on a back side of the swing arm 21. Each swing arm 21 includes a clamping member 24 which is formed at its lower end and which pivotally fastens the electrical connector 20 to the front lower support rod 14 between a pair of lower guide rails 16. Each clamping member 24 on a swing arm 21 fills the interval between the lower guide rail 16 which supports its associated circuit board 17 and an adjacent lower guide rail 16. The clamping member 24 on each connector 20 is offset slightly to one side to allow clearance for its associated lower guide rail 16 and to properly align the edge connectors 23 with their associated circuit board 17. In this manner, spacing is maintained between the lower guide rails 16 and alignment is maintained between each electrical connector 20 and its associated circuit board 17.

Each swing arm 21 is molded as a single unit from an electrically insulating thermosetting plastic material. As shown best in FIG. 6, the clamping member 24 includes a pair of yieldable opposing fingers 24' that are forced apart to snap over and substantially around the front lower support rod 14. A metallic clip 25 has yieldable opposing fingers 25' that snap over and substantially around the fingers of the clamping member 24 to completely surround the front lower support rod 14 and fasten the fingers of the clamping member 24 in place thereon. The clamping member 24 includes a pair of grooves 26 and the clip 25 includes a pair of mating projections 27. The projections 27 of the clip 25 are seated in the grooves 26 of the clamping member 24 when the clip 25 is installed to hold the electrical connector 20 in place on the front lower support rod 14.

The clamping member 24 extends from the back side of the swing arm 21 and the mouth formed between its opposing fingers 24' is directed substantially perpendicular to the longitudinal, or radial, axis of the swing arm 21. A pair of spaced retainer walls 28 are formed on the front of the swing arm 21. Each wall 28 has a pair of openings 29 formed therein to provide a point of attachment for a tie 30 which binds a bundle of wires 31 as shown in FIG. 1. The wires 31 connect the terminals 22 on the electrical connector 20 to the I/O devices, not shown in the drawings, and the tie 30 insures that the wires do not obstruct the swinging motion of the electrical connector 20.

Referring to FIGS. 1 and 3, the swing arm 21 of the electrical connector 20 swings about the lower front support rod 14 between an upright operating position and a maintenance position. When pivoted to its operating position, the electrical connector 20 engages its associated circuit board 17 and the edge connectors 23 thereon, making electrical connection with the terminal pads 19 on the circuit board 17 to establish electrical continuity between the pads 19 and the wire terminals 22. When the electrical connector 20 is pivoted downward to its maintenance position, this continuity is broken and the connector 20 is completely clear of the circuit board 17 to allow its removal from the frame 10 for repair or replacement. Each electrical connector 20 thus pivots in a vertical swing plane about a pivot axis defined by the front lower support rod 14. The vertical swing plane is aligned with the plane defined by its associated circuit board 17 to insure accurate and easy connection thereto.

As shown best in FIG. 3, each electrical connector 20 is locked in its operating position by a swing arm latching mechanism which includes a swing arm latch 32 formed at the upper, or extended, end of the swing arm 21. A flexible keeper 33 is mounted on the front edge of each circuit board 17, the keeper 33 including a notch 34 which receives the swing arm latch 22. The keeper 33 may be flexed upward to enlarge the notch 34 and release the upper end of the electrical connector 20.

As shown in FIGS. 1 and 2, the electrical connectors 20 extend over only a portion of the front edge of each circuit board 17. A set of status indicator lights 35 are mounted along the remaining portion of the front edge of each circuit board 17. Light emitting diodes (LEDs) are used as status indicator lights in the preferred embodiment. Other circuit elements, such as trimmer potentiometers can also be mounted on the circuit board edge instead of the status indicator lights 35.

As shown best in FIGS. 1 and 2, the swing arms 21 are elongated, and each has a set of twenty wire terminals 22, disposed in a longitudinal row on its front side. The wire terminals 22 are separated by a set of spaced transverse walls 36 which are integrally formed on the front side of the swing arm 21, and arranged in a longitudinal row extending from the lower end to the upper end of the swing arm 21. A wire stop wall 37 is also formed on the front side and extends along the length of the swing arm 21 to connect with each transverse wall 36. The wire stop wall 37 together with the transverse walls 36 form a three-sided barrier for each wire terminal 22 which confines the wires 31 connected to it and prevents them from coming into contact with adjacent terminals or adjacent connectors.

Referring to FIGS. 4 and 5, each wire terminal 22 includes a wire terminal screw 38 which extends through the swing arm 21 and which is held in place by a wire terminal nut 39. The wire terminal nuts 39 are disposed in a longitudinal row of compartments 40 formed on a portion of the back side of the swing arm 21. Formed on the back side of the swing arm 21 adjacent the compartments 40 is a longitudinal channel 41 in which twenty edge connectors 23 are disposed in a longitudinal row. The edge connectors 23 each include a pair of bifurcated metallic fingers 43 which connect to a respective one of the terminal pads 19 on the circuit board 17 when the electrical connector 20 is moved to its operating position. Metal straps 44 extend through the swing arm 21 to connect each edge connector 23 to one of the wire terminals 22 and to thereby establish electrical continuity between the circuit board terminal pads 19 and the wires 31.

As shown in FIG. 3, each circuit board 17 is held in the frame 10 by a circuit board latching mechanism, which includes a circuit board latch 46 pivotally mounted on the front edge support rod 13 between a pair of adjacent upper guide rails 15. The circuit board latch has a ledge 47 and a hook 48 that releasably engages a lug 49 which is mounted on the uppermost portion of the front edge of each circuit board 17. Preferably, the lug 49 is pivotable to aid the release of the circuit board latch 46. The circuit board latch 46 pivots in a plane defined by its associated circuit board 17 about an axis defined by the front upper support rod 13 between an open position and a closed position in which the hook 48 engages the lug 47 and holds the circuit board 17 in position. Further details of the construction of the circuit board latch 46 are disclosed in U.S. Pat. No. 3,691,430 issued to Lawrence F. Freitag and entitled "Circuit Board Assembly with Positive Latch".

Referring again to FIG. 1, it is apparent that the electrical connectors 20 can be swung to their maintenance position for inspection of their associated circuit board 17 without disturbing the status indicator lights 35. A circuit board 17 can then be removed, if necessary, by releasing its latch 46 and sliding it out of the frame 10 along the guide rails 15 and 16. The status indicator lights 35 remain attached to the circuit board 17 as it is removed. When a circuit board 17 has been inspected or replaced, its associated electrical connector 20 is pivoted back into the operating position once again.

We claim:

1. A circuit board assembly which comprises:
   a frame;
   an upper and a lower support rod mounted to the frame substantially parallel to each other;
   a plurality of lower guide rails mounted at regular intervals along the lower support rod;
   a plurality of upper guide rails mounted at regular intervals along the upper support rod, each of the upper guide rails being disposed above one of the lower guide rails to receive a circuit board therebetween; and
   an electrical connector associated with a circuit board which is mounted between one of the upper guide rails and one of the lower guide rails, the electrical connector being rotatably mounted at one end to one of the support rods in an interval between the guide rail which mounts the circuit board and an adjacent guide rail, the electrical connector being rotatable between an operating position in which it engages the circuit board and a maintenance position in which the circuit board can be removed from between the upper and lower guide rails which mount it.

2. The circuit board assembly of claim 1 in which a plurality of circuit boards are mounted between opposing pairs of upper and lower guide rails and a plurality of the electrical connectors are mounted to one of the support rods alternately with the plurality of guide rails mounted thereon, each connector having a base portion and another portion formed on one end of the base portion and offset towards one side of the base portion, said offset portion being mounted between respective pair of adjacent guide rails, to maintain spacing between the guide rails and to maintain alignment of each electrical connector with its associated circuit board.

3. The circuit board assembly of claim 1 in which the electrical connector includes:
   an integrally molded swing arm with a base portion and with a clamping member formed at one end of the base portion and offset towards one side of the base portion for rotatably mounting the swing arm in alignment with its associated circuit board;
   edge connection means formed along one side of the swing arm to engage and make electrical connection with the circuit board when the electrical connector is pivoted into its operation position; and
   wire terminal means formed along the other side of the swing arm for electrically connecting the edge connection means to a set of wires.

4. The circuit board assembly of claim 3 in which the clamping member includes a pair of yieldable opposing fingers that snap over and substantially around the mounting support rod.

5. The circuit board assembly of claim 4 further comprising a clip having yieldable opposing fingers that snap over and around the fingers of the clamping member to completely surround the mounting support rod and hold the clamping member fingers in place thereon.

6. The circuit board assembly of claim 3 in which the swing arm includes a swing arm latch formed at its extended end, and in which a flexible keeper is mounted to the circuit board along its edge, the keeper including a notch which receives and retains the swing arm latch to hold the swing arm in its operating position.

7. The circuit board assembly of claim 6 in which the swing arm extends over a portion of the circuit board edge and a set of circuit elements are mounted on the circuit board and disposed along the remaining portion of the circuit board edge.

8. The circuit board assembly of claim 7 further comprising:
   a lug mounted to the circuit board and disposed along the edge of the circuit board which engages the electrical connector; and
   a circuit board latch pivotally mounted to the other one of the support rods for engaging said lug to maintain the circuit board in position between the upper and lower guide rails.

9. In a circuit board assembly having a plurality of closely spaced, substantially parallel circuit boards and a plurality of support rods extending substantially perpendicular to the planes defined by the circuit boards, an electrical connector which comprises:

an elongated swing arm including front and back sides, a channel formed along the back side, and a clamping member integrally formed at one end with a pair of yieldable, opposing fingers that snap over and substantially around one of the support rods to rotatably mount the swing arm;

a set of wire terminals disposed on the front side of the swing arm and extending through the swing arm to the back side; and edge connection means electrically connected to the wire terminals and disposed in the channel to engage and make electrical connection to an associated circuit board.

10. The electrical connector of claim 9, which includes a base portion that extends from the clamping member to support the wire terminals and the edge connection means, the base portion being offset towards one side of the clamping member for alignment of the electrical connector with its associated circuit board.

11. The electrical connector of claim 9, which includes a clip having yieldable, opposing fingers that snap over and around the fingers of the clamping member to completely surround the mounting support rod.

12. The electrical connector of claim 9, wherein a set of spaced transverse walls are disposed on the front side of the swing arm in a longitudinal row, and a wire stop wall is formed along the front side of the swing arm to connect the transverse walls and to form a three-sided barrier around each of the wire terminals.

* * * * *

UNITED STATES PATENT OFFICE
CERTIFICATE OF CORRECTION

Patent No. 4,151,580                    Dated April 24, 1979

Inventor(s) Odo J. Struger et al

It is certified that error appears in the above-identified patent and that said Letters Patent are hereby corrected as shown below:

Column 1, line 68    "guid rail" should be -- guide rail --

Column 2, line 6     "hardward" should be -- hardware --

Column 2, line 17    "figures" should be -- fingers --

Column 4, line 45    "22" should be -- 32 --

Column 5, line 25    "edge" should be -- upper --

Signed and Sealed this

Tenth Day of July 1979

[SEAL]

Attest:

Attesting Officer

LUTRELLE F. PARKER
*Acting Commissioner of Patents and Trademarks*